(12) United States Patent
Li et al.

(10) Patent No.: US 12,272,404 B2
(45) Date of Patent: *Apr. 8, 2025

(54) PROGRAMMING FOR THREE-DIMENSIONAL NAND MEMORY

(71) Applicant: YANGTZE MEMORY TECHNOLOGIES CO., LTD., Wuhan (CN)

(72) Inventors: Haibo Li, Wuhan (CN); Joohyun Jin, Wuhan (CN); Chao Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/537,263

(22) Filed: Dec. 12, 2023

(65) Prior Publication Data

US 2024/0112739 A1 Apr. 4, 2024

Related U.S. Application Data

(63) Continuation of application No. 17/518,783, filed on Nov. 4, 2021, now Pat. No. 11,887,671, which is a
(Continued)

(51) Int. Cl.
*G11C 16/10* (2006.01)
*G11C 16/08* (2006.01)
(Continued)

(52) U.S. Cl.
CPC ............ *G11C 16/102* (2013.01); *G11C 16/08* (2013.01); *G11C 16/14* (2013.01); *G11C 16/24* (2013.01);
(Continued)

(58) Field of Classification Search
CPC ....... G11C 16/102; G11C 16/08; G11C 16/14; G11C 16/24; G11C 16/26; G11C 16/3404;
(Continued)

(56) References Cited

U.S. PATENT DOCUMENTS 9,858,995 B1 1/2018 Lin et al.
10,979,815 B2 4/2021 Liu et al.
(Continued)

FOREIGN PATENT DOCUMENTS

CN 110580928 A 12/2019
CN 110892482 A 3/2020
(Continued)

OTHER PUBLICATIONS

International Search Report issued in corresponding International Application No. PCT/CN2021/0804829, mailed Jan. 7, 2022, 4 pages.
(Continued)

*Primary Examiner* — Michael T Tran
(74) *Attorney, Agent, or Firm* — BAYES PLLC

(57) ABSTRACT

A memory device includes selected word lines coupled to first memory cells, a first group of unselected word lines coupled to second memory cells, a second group of unselected word lines coupled to third memory cells; and a peripheral circuit coupled to the selected word lines, the first group of unselected word lines, and the second group of unselected word lines. The peripheral circuit is configured to apply program voltages on the selected word lines, apply first pass voltages on the first group of unselected word lines; and apply second pass voltages on the second group of unselected word lines. A first maximum value of the first pass voltages is different from a second maximum value of the second pass voltages.

20 Claims, 11 Drawing Sheets

Related U.S. Application Data continuation of application No. PCT/CN2021/084829, filed on Apr. 1, 2021.

(51) Int. Cl.
*G11C 16/14* (2006.01)
*G11C 16/24* (2006.01)
*G11C 16/26* (2006.01)
*G11C 16/34* (2006.01)

(52) U.S. Cl.
CPC .......... *G11C 16/26* (2013.01); *G11C 16/3404* (2013.01)

(58) Field of Classification Search
CPC .. G11C 16/3427; G11C 16/10; G11C 16/0483
USPC ...................................... 365/189.011, 185.24
See application file for complete search history.

(56) References Cited

U.S. PATENT DOCUMENTS

| | | | |
|---|---|---|---|
| 10,998,049 B1 | 5/2021 | Wei et al. | |
| 11,024,371 B2 | 6/2021 | Cui et al. | |
| 11,322,207 B1* | 5/2022 | Cheng | G11C 16/0483 |
| 2009/0168537 A1 | 7/2009 | Kim | |
| 2010/0322012 A1 | 12/2010 | Suzuki et al. | |
| 2014/0340964 A1 | 11/2014 | Shiino | |
| 2015/0071008 A1 | 3/2015 | Yang et al. | |
| 2015/0078097 A1 | 3/2015 | Yano | |
| 2016/0307638 A1 | 10/2016 | Shirakawa et al. | |
| 2016/0343414 A1 | 11/2016 | Lee et al. | |
| 2019/0027227 A1 | 1/2019 | Hsu | |
| 2019/0066793 A1 | 2/2019 | Shin et al. | |
| 2019/0355429 A1 | 11/2019 | Chen et al. | |
| 2019/0385658 A1 | 12/2019 | Lee | |
| 2020/0020404 A1 | 1/2020 | Kim | |
| 2020/0143890 A1 | 5/2020 | Lee | |
| 2020/0168279 A1 | 5/2020 | Lee et al. | |
| 2020/0350024 A1 | 11/2020 | Kwak | |
| 2021/0020256 A1* | 1/2021 | Kim | G11C 16/26 |
| 2021/0210146 A1* | 7/2021 | Lee | G11C 16/30 |
| 2021/0241838 A1* | 8/2021 | Cho | G11C 11/5671 |
| 2021/0280251 A1* | 9/2021 | Lee | G11C 16/0483 |
| 2021/0304810 A1* | 9/2021 | Lee | G11C 16/08 |
| 2021/0366550 A1* | 11/2021 | Cho | G11C 16/0483 |
| 2021/0366551 A1* | 11/2021 | Lee | G11C 16/26 |
| 2021/0398583 A1* | 12/2021 | An | G11C 16/0483 |
| 2022/0101932 A1* | 3/2022 | Kalavade | G11C 16/26 |
| 2022/0102365 A1* | 3/2022 | Ha | G11C 16/0466 |
| 2022/0208276 A1* | 6/2022 | Wu | G11C 16/0483 |
| 2023/0143181 A1* | 5/2023 | Tan | G06F 3/0656 711/103 |
| 2023/0368849 A1* | 11/2023 | Lin | G11C 16/10 |
| 2023/0386585 A1* | 11/2023 | Guo | G11C 11/5671 |
| 2023/0402096 A1* | 12/2023 | Park | G11C 16/32 |
| 2023/0402111 A1* | 12/2023 | Yabe | G11C 16/32 |
| 2023/0410913 A1* | 12/2023 | Sumi | G11C 16/10 |

FOREIGN PATENT DOCUMENTS

| | | |
|---|---|---|
| CN | 110945591 A | 3/2020 |
| CN | 111758130 A | 10/2020 |
| TW | 663602 B | 6/2019 |
| WO | 01/65563 A2 | 9/2001 |
| WO | 2005/015566 A1 | 2/2005 |
| WO | 2015037159 A1 | 3/2015 |

OTHER PUBLICATIONS

Yang Liauw, Young Feng, Nonvolatile Monolithic Three-Dimensional Field Programmable Gate Array with Stacked Resistive Configuration Memory, 2012, Stanford University. All pages. (Year: 2012).

* cited by examiner

PROGRAMMING FOR THREE-DIMENSIONAL NAND MEMORY

CROSS-REFERENCE TO RELATED APPLICATIONS

This application is a continuation of U.S. application Ser. No. 17/518,783, filed on Nov. 4, 2021 and now patented with U.S. patent Ser. No. 11,887,671, which is a continuation of International Application No. PCT/CN2021/084829, filed on Apr. 1, 2021, both of which are incorporated herein by reference in their entireties.

TECHNICAL FIELD

The present disclosure generally relates to the field of semiconductor technology, and more particularly, to methods of programming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. During operation, the memory cells in a memory page sharing the same word line can be programmed and read simultaneously. However, not all the memory cells in the same memory page are selected to be programed to the same logic state. Those unselected memory cells can suffer program disturb. Similarly, unselected memory cells in the same memory string can suffer pass disturb. Therefore, a need exists for a method to suppress both the program disturb and the pass disturb to improve the performance and reliability of the 3D NAND memory.

SUMMARY

Embodiments of programming methods and circuits for a three-dimensional (3D) memory device is described in the present disclosure.

One aspect of the present disclose provides a method for programming a three-dimensional (3D) memory device. The 3D memory device has a plurality of memory strings with memory cells vertically stacked, and each memory cell is addressable through a word line and a bit line. The method for programming the 3D memory device includes the following steps: applying a program voltage on a selected word line; applying a first pass voltage on a first group of unselected word lines; and applying a second pass voltage on a second group of unselected word lines, wherein the second pass voltage is different from the first pass voltage.

In some embodiments, the method also includes determining a first maximum pass voltage for a first set of unselected memory cells connected to the first group of unselected word lines to suppress pass disturb on the first set of unselected memory cells; and determining a second maximum pass voltage for a second set of unselected memory cells connected to the second group of unselected word lines to suppress pass disturb on the second set of unselected memory cells.

In some embodiments, the determining the first maximum pass voltage includes measuring shifts of threshold voltages of the first set of unselected memory cells; and setting the first maximum pass voltage as the first pass voltage when the shifts of the threshold voltages of the first set of unselected memory cells are less than a maximum allowed shift.

In some embodiments, the method also includes reducing the first pass voltage by a predetermined value when the shifts of the threshold voltages of the first set of unselected memory cells are larger than the maximum allowed shift.

In some embodiments, the measuring the shifts of the threshold voltages of the first set of unselected memory cells includes measuring the threshold voltages of the first set of unselected memory cells that are at an erased state.

In some embodiments, the determining the second maximum pass voltage includes measuring shifts of threshold voltages of the second set of unselected memory cells; and setting the second maximum pass voltage as the second pass voltage when the shifts of the threshold voltages of the second set of unselected memory cells are less than a maximum allowed shift.

In some embodiments, the method also includes reducing the second pass voltage by a predetermined value when the shifts of the threshold voltages of the second set of unselected memory cells are larger than the maximum allowed shift.

In some embodiments, the measuring the shifts of the threshold voltages of the second set of unselected memory cells includes measuring the threshold voltages of the second set of unselected memory cells that are at an erased state.

In some embodiments, the applying the first pass voltage and the applying the second pass voltage include applying, initially, voltages with pre-given values to suppress program disturb on a fourth set of unselected memory cells, wherein the fourth set of unselected memory cells are connected to the selected word line.

In some embodiments, the method also includes determining the voltages with the pre-given values when shifts of threshold voltages of the fourth set of unselected memory cells are less than a maximum allowed shift.

In some embodiments, the method also includes connecting a selected bit line to ground to program a selected memory cell connected to the selected bit line and the selected word line; and applying an inhibit voltage on an unselected bit line to inhibit programming an unselected memory cell connected to the unselected bit line.

In some embodiments, the applying the program voltage includes applying a voltage in a range between about 10 V and 20 V.

In some embodiments, the applying the first pass voltage and the applying the second pass voltage comprise applying a voltage in a range between about 6 V to about 13 V.

Another aspect of the present disclosure provides a three-dimensional (3D) memory device. The 3D memory device includes a plurality of memory cells that are connected to word lines and bit lines configured for addressing each of the plurality of memory cells, wherein the plurality of memory cells are vertically stacked. The 3D memory device also includes a peripheral circuit, configured to program a selected memory cell. The peripheral circuit includes a control circuit, configured to send a control signal to a word line driver. The word line driver, according to the control signal, is configured to apply a program voltage on a selected word line; apply a first pass voltage on a first group of unselected word lines; and apply a second pass voltage on a second group of unselected word lines, wherein the second pass voltage is different from the first pass voltage.

In some embodiments, the peripheral circuit is further configured to connect a selected bit line to ground to program the selected memory cell addressed by the selected word line and the selected bit line; and apply an inhibit voltage on an unselected bit line to inhibit programming an unselected memory cell addressed by the unselected bit line.

In some embodiments, the peripheral circuit is further configured to determine a first maximum pass voltage to suppress pass disturb on a first set of unselected memory cells connected to the first group of unselected word lines; and determine a second maximum pass voltage to suppress pass disturb on a second set of unselected memory cells connected to the second group of unselected word lines.

In some embodiments, the first maximum pass voltage is determined when shifts of threshold voltages of the first set of unselected memory cells are less than a maximum allowed shift.

In some embodiments, the second maximum pass voltage is determined when shifts of threshold voltages of the second set of unselected memory cells are less than a maximum allowed shift.

In some embodiments, the first set of unselected memory cells and the second set of unselected memory cells are at an erased state.

In some embodiments, the shifts of threshold voltages of a fourth set of unselected memory cells connected to the selected word line are less than a maximum allowed shift when the first maximum pass voltage and the second maximum pass voltage are applied on the first group of unselected word lines and the second group of selected word lines, respectively.

The present disclosure further provides a storage system, wherein the storage system includes a memory controller and a three-dimensional memory device. The memory chip includes a plurality of memory cells connected to word lines and bit lines configured for addressing each of the plurality of memory cells, wherein the plurality of memory cells are vertically stacked. The memory chip also includes a peripheral circuit configured to program a selected memory cell, the peripheral circuit comprising a control circuit. The control circuit is configured to send a control signal to a word line driver, wherein the word line driver, according to the control signal, is configured to apply a program voltage on a selected word line; apply a first pass voltage on a first group of unselected word lines; and apply a second pass voltage on a second group of unselected word lines, wherein the second pass voltage is different from the first pass voltage.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
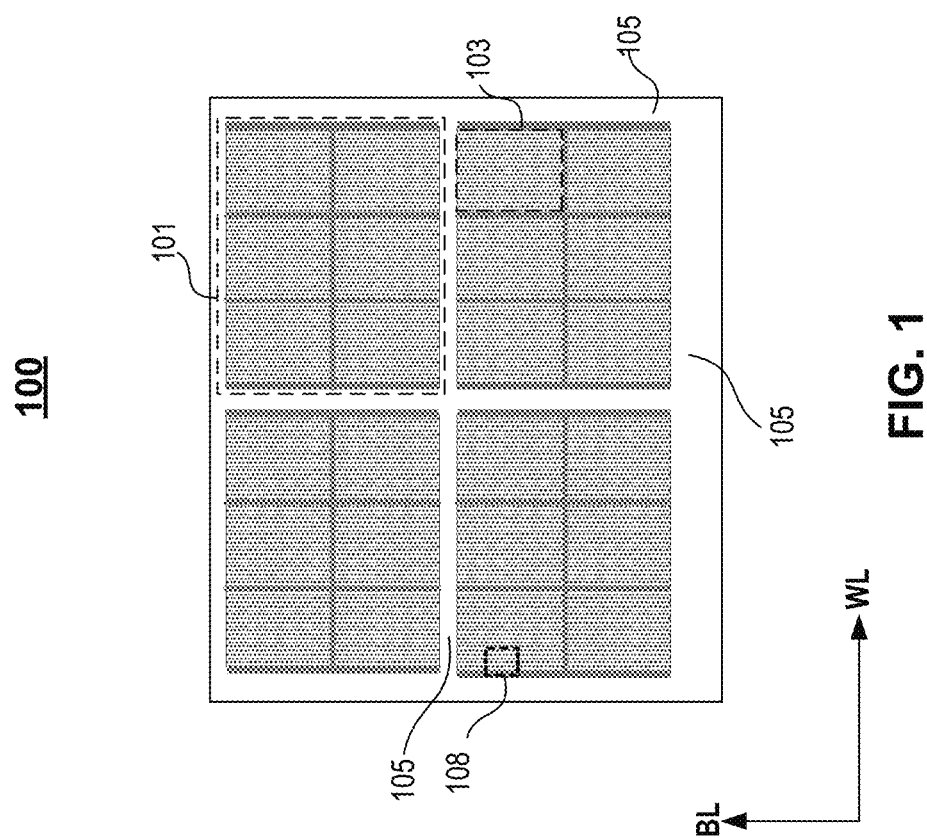
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
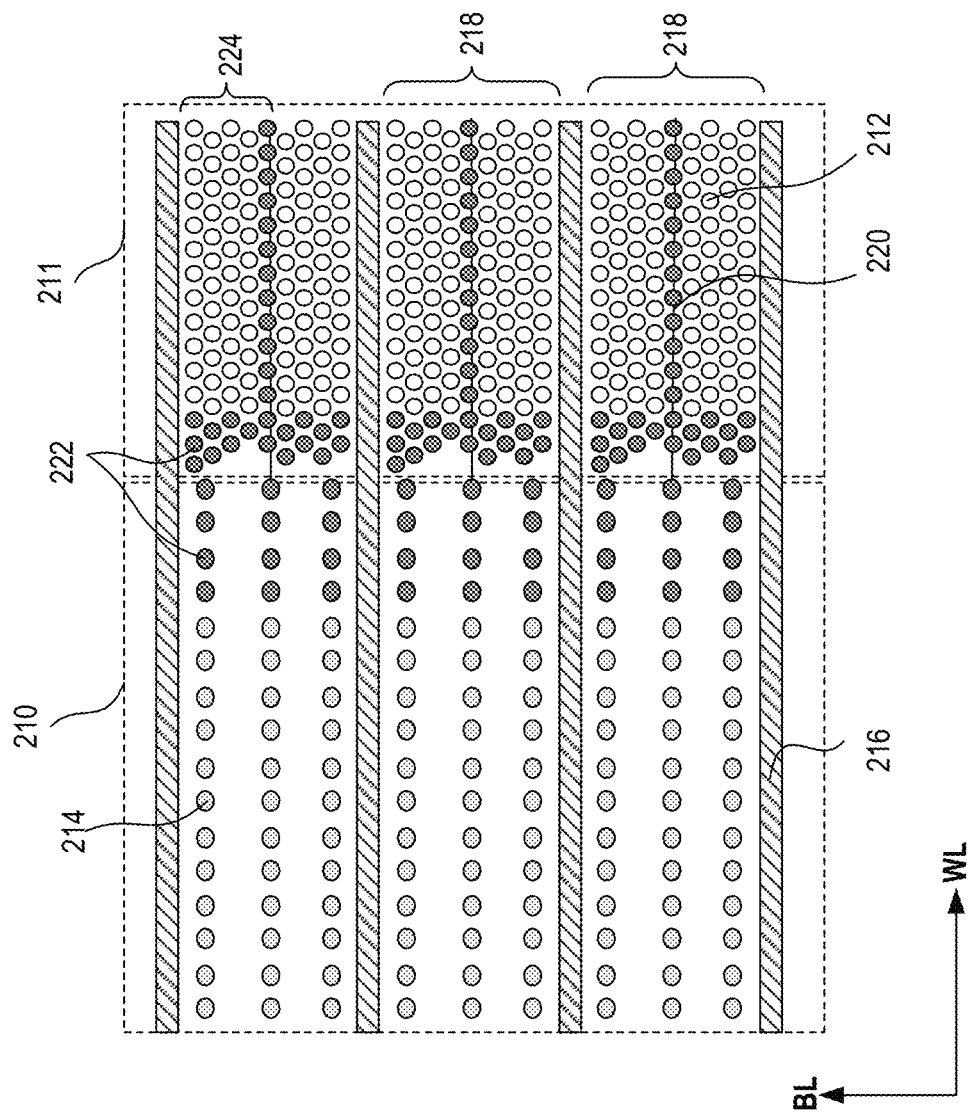
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact (e.g., array common source) for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
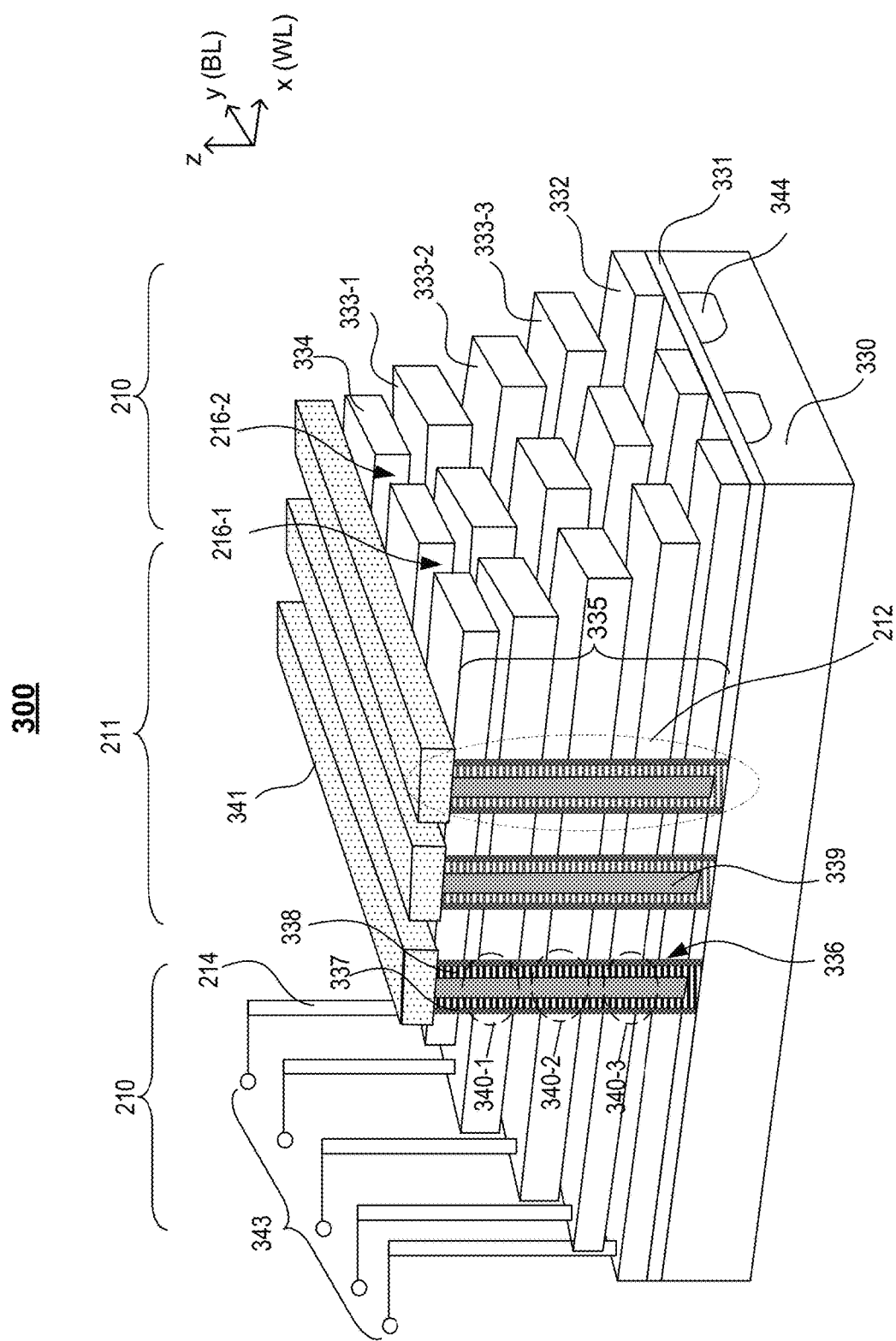
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 (e.g., 340-1, 340-2, 340-3) can be formed at the intersection of the control gate 333 (e.g., 333-1, 333-2, 333-3) and the memory string 212. A portion of the channel layer 338 responds to the respective control gate is also referred to as the channel 338 of the memory cell. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact (i.e., array common source) and dummy memory string. These structures are not shown in FIG. 3 for simplicity.

Figure 4:
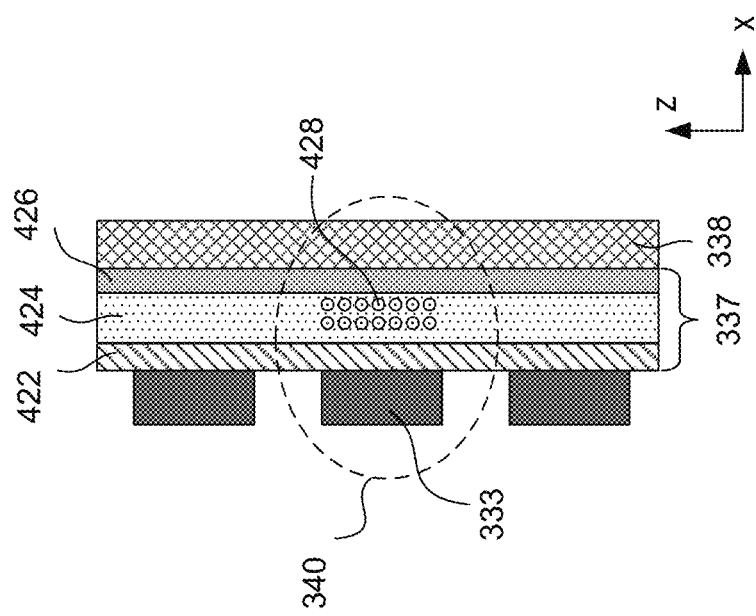
FIG. 4 illustrates a cross-sectional view of 3D memory device, according to some embodiments of the present disclosure.

FIG. 4 illustrates a schematic cross-section of a 3D NAND memory 400, which includes memory cells similar to the memory cell 340 in FIG. 3. The memory cell 340 includes a control gate (e.g., the control gate 333), a memory film (e.g., the memory film 337) and a channel layer (e.g., the channel layer 338, also referred to as the channel).

In a 3D NAND memory, the memory film 337 can be disposed on a sidewall of each channel hole 336 (illustrated in FIG. 3). In some embodiments, the memory film 337 can include a barrier layer 422, a storage layer 424, and a tunneling layer 426. The barrier layer 422 can be used to block the movement of charge carriers 428 between the control gate 333 and the storage layer 424. The barrier layer 422 can include silicon oxide and high dielectric constant (high-k) dielectrics, for example, aluminum oxide. The storage layer 424 can be used to store charge carriers 428 and can include silicon nitride. The storage and/or removal of charge carriers in the storage layer 424 can impact the on/off state and/or a conductance of the channel layer 338. The tunneling layer 426 can be used to control the tunneling of charge carriers 428 (electrons or holes) between the channel layer 338 and the storage layer 424. The tunneling layer 426 can be silicon oxide, silicon nitride, silicon oxynitride, or any combination thereof. In a 3D NAND memory, the channel layer 338 can be disposed on a sidewall of the memory film 337 in the channel hole 336 (in FIG. 3). The channel layer 338 can include amorphous silicon, polycrystalline silicon, and/or monocrystalline silicon.

Figure 5:
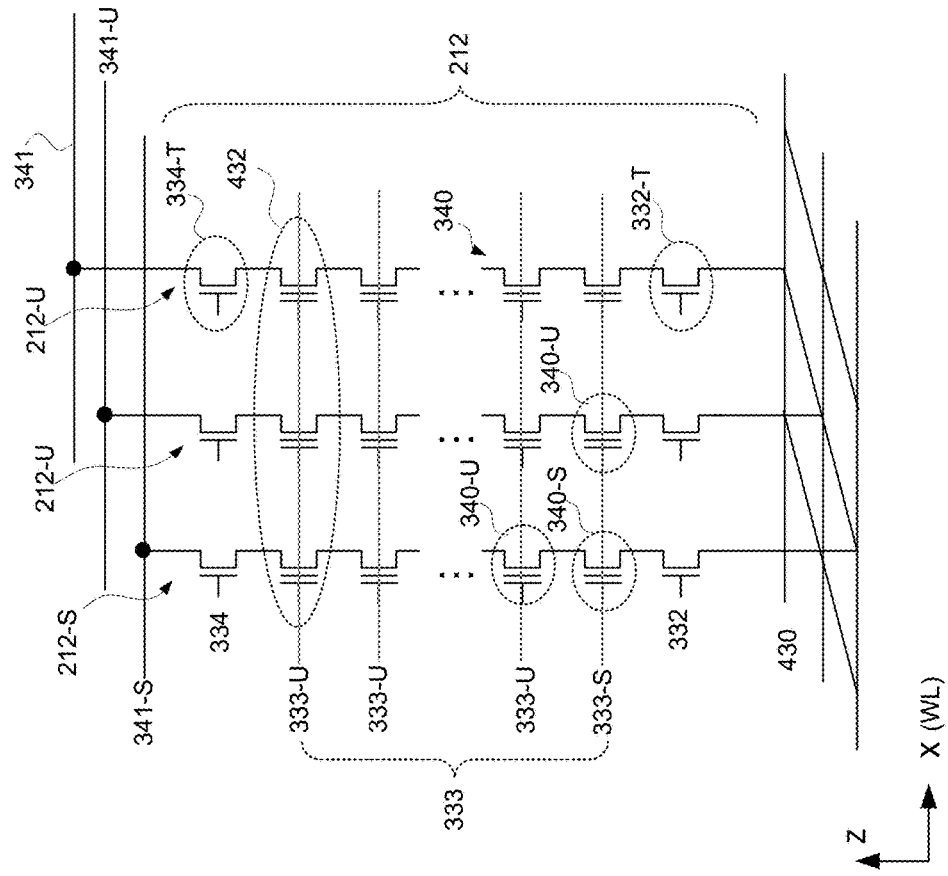
FIGS. 5-6 illustrate schematic circuits diagram of 3D memory devices, according to some embodiments of the present disclosure.

FIG. 5 shows a schematic circuit diagram of the memory block 103 (also referred to as memory array 103), according to some embodiments of the present disclosure. The memory array 103 includes a plurality of memory strings 212, each memory string 212 having a plurality of memory cells 340. The memory string 212 also includes at least one field effect transistor (e.g., MOSFET) at each end, which is controlled by a lower select gate (LSG) 332 and a top select gate (TSG) 334, respectively. And the two respective transistors are referred to as lower and top select transistors 332-T and 334-T. The memory cell 340 can be controlled by the control gate 333, where some control gates 333 can be electrically connected to the same word line of the memory array 103. Thus, for simplicity, the control gates and their corresponding word lines are used exchangeably in the present disclosure. The drain terminal of the top select transistor 334-T can be connected to the bit line 341, and the source terminal of the lower select transistor 332-T can be connected to an array common source (ACS) 430. The ACS 430 can be shared by the memory strings 212 in an entire memory block, and is also referred to as the common source line.

In some embodiments, the memory array 103 can be formed based on floating gate technology. In some embodiments, the memory array 103 can be formed based on charge trapping technology. The NAND flash memory based on charge trapping can provide high storage density and high intrinsic reliability. Storage data or logic states ("states," e.g., threshold voltages $V_{th}$ of the memory cell 340) depends on the number of charge carriers trapped in a storage layer (e.g., the storage layer 424 in FIG. 4).

In a NAND flash memory, a read operation and a write operation (also referred to as program operation) can be performed for a memory page 432, which includes all memory cells 340 sharing the same word line, and an erase operation can be performed for the memory block 103.

Referring to FIGS. 4 and 5, in a NAND memory, the memory cell 340 can be in an erased state ER or a programmed state P1. Initially, the memory cells 340 in the memory array 103 can be reset to the erased state ER as logic "1" by implementing a negative voltage difference between the control gates 333 and the channel 338 such that trapped charge carriers in the storage layer of the memory cells 340 can be removed. For example, the negative voltage difference can be induced by setting the control gates 333 of the memory cells 340 to ground, and applying a high positive voltage (an erase voltage $V_{erase}$) to the ACS 430. At the erased state ER ("state ER"), the threshold voltage $V_{th}$ of the memory cells 340 can be reset to the lowest value.

During programming (i.e., writing), a positive voltage difference between the control gates 333 and the channel 338 can be established by, for example, applying a program voltage $V_{pgm}$ (e.g., a positive voltage pulse between 10 V and 20 V) on the control gate 333, and grounding the corresponding bit line 341. As a result, charge carriers (e.g., electrons) can be injected into the storage layer of the memory cell 340, thereby increasing the threshold voltage $V_{th}$ of the memory cell 340. Accordingly, the memory cell 340 can be programmed to the programmed state P1 ("state P1").

The state of the memory cell (e.g., state ER or state P1) can be determined by measuring or sensing the threshold voltage $V_{th}$ of the memory cell. During a read operation, a read voltage $V_{read}$ can be applied on the control gate 333 of the memory cell and current flowing through the memory cell can be measured at the bit line 341.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Because the control gates 333 of the memory cells 340 in the same memory page 432 are electrically connected together as the word line (i.e., the WL 333), the program operation controlled by the biases of the WL 333 affects all the memory cells 340 in the same memory page 432. Accordingly, unselected memory cells addressed by a selected WL are subjected to program disturb. Similarly, unselected memory cells addressed by a selected BL are subjected to pass disturb. Program and pass disturbs are discussed in detail below.

When the program voltage $V_{pgm}$ is applied on a selected WL 333-S, a selected memory cell 340-S on a selected memory string 212-S can be programmed to a logic state (e.g., state P1). To achieve this, a selected bit line 341-S that is connected to the selected memory string 212-S can be grounded and the top select transistor 334-T on the selected memory string 212-S can be switched on. A pass voltage $V_{pass}$ can be applied on unselected WLs 333-U to switch on unselected memory cells 340-U. In some embodiments, the pass voltage $V_{pass}$ can be in a range between 6 V and 13 V. The unselected memory cell 340-U on the selected memory string 212-S can be switched on when the pass voltage $V_{pass}$ is higher than the threshold voltage $V_{th}$ of the unselected memory cell 340-U. As such, the channel 338 of the selected memory string 212-S can be tied to ground through the selected bit line 341-S. When the program voltage $V_{pgm}$ is applied on the selected WL 333-S, the large potential difference between the control gate 333 and the channel 338 results in tunneling of charge carriers (i.e., electrons) into the memory film 337. By adjusting the program voltage $V_{pgm}$, the number of charge carriers stored in the memory film 337 can be adjusted. And the threshold voltage $V_{th}$ of the selected memory cell 340-S can be adjusted accordingly. As such, the selected memory cell 340-S can be programmed to a target state.

In some embodiments, a single pass voltage $V_{pass}$ is chosen for all unselected WL 333-U during the program operation where the single pass voltage $V_{pass}$ is higher than the maximum threshold voltage $V_{th\_max}$ of all the memory cells 340. Although the pass voltage $V_{pass}$ is usually lower than the program voltage $V_{pgm}$, the pass voltage $V_{pass}$ can also induce tunneling of the charge carriers and thereby cause a shift $\Delta V_{th}$ of the threshold voltage $V_{th}$ in the unselected memory cells, and results in the pass disturb. The pass disturb cumulates with the number of program operations and could eventually lead to a program failure.

Similarly, during the program operation, not all the memory cells 340 connected to the selected WL 333-S need to be programmed to the same state. The unselected memory cells 340-U connected to the selected WL 333-S, are subjected to program disturb when the program voltage $V_{pgm}$ is applied on the selected WL 333-S. The program disturb can be suppressed by implementing a self-boosting technique, where the positive voltage difference between the selected WL 333-S and the channel 338 of the unselected memory cell 340-U can be reduced and thereby the electric field responsible for the injection of the charge carriers can be reduced. Self-boosting can be achieved by applying an inhibit voltage $V_{inhibit}$ on an unselected bit line 341-U that is connected to an unselected memory string 212-U. In some embodiment, the inhibit voltage $V_{inhibit}$ can be a supply voltage $V_{cc}$ that is in a range between 3 V to 5 V. In the unselected memory string 212-U, the top select transistor 332-T can be switched on and the lower select transistor 332-T can be switched off. Initially, the channel of the unselected memory string 212-U can be pre-charged through the unselected bit line 341-U. When the pass voltage $V_{pass}$ or the program voltage $V_{pgm}$ is applied to the unselected memory cells 340-U, the electric potential of the channel 338 of the unselected memory string 212-U rises through capacitive coupling such that the top select transistor 332-T can be switched off. Subsequently, the channel 338 of the unselected memory string 212-U becomes floating, and the electric potential of the channel 338 continues rising until becoming very close to (e.g., about 80% of) the pass voltage $V_{pass}$ or the program voltage $V_{pgm}$. The raised electric potential of the channel 338 prevents the tunneling of charge carriers in the unselected memory cells 340-U when the program voltage $V_{pgm}$ is applied on the selected WL 333-S. Thus, by applying the inhibit voltage $V_{inhibit}$ on the unselected bit line 341-U, the unselected memory string 212-U is inhibited from being programmed.

While self-boosting is more effective with higher pass voltage $V_{pass}$, the unselected memory cells 340-U can be programmed if the pass voltage $V_{pass}$ is too high, resulting in the shift $\Delta V_{th}$ of the threshold voltage $V_{th}$ of the unselected memory cells 340-U. Therefore, to suppress program disturb and pass disturb, the pass voltage $V_{pass}$ needs to be within a certain range. In some embodiments, a maximum pass voltage $V_{pass\_max}$ can be determined to suppress both the pass disturb and the program disturb.

Referring to FIG. 3, due to process variation at manufacturing, the channel hole 336 (in FIG. 3) can have different sizes and shapes. The memory film 337, including the barrier layer 422, the storage layer 424, and tunneling layer 426, can also have various thickness and composition. In some embodiments, the process variation runs along the vertical direction (i.e., z-direction) perpendicular to the substrate 330. For example, the channel hole 336 can have a diameter smaller at bottom (close to the substrate 330) and larger on the top (further away from the substrate 330). And the memory film 337 can be thinner at the bottom and thicker on the top. Accordingly, the memory cells 340 (e.g., 340-1, 340-2, 340-3) connected to different word lines (e.g., 333-1, 333-2, 333-3) can behave differently under the same bias conditions. In some embodiments, the memory cells at the bottom can experience larger shift $\Delta V_{th}$ of the threshold voltage $V_{th}$ because they are more vulnerable to the pass disturb. Error bits increase when the memory cells are not held at a target threshold voltage $V_{th}$. The shift of the threshold voltage $V_{th}$, caused by the pass disturb, increases with increased program cycles. Accordingly, different maximum pass voltages $V_{pass\_max}$ can be implemented for different word lines on the basis of a vulnerability of corresponding memory cells to the pass disturb.

Figure 6:
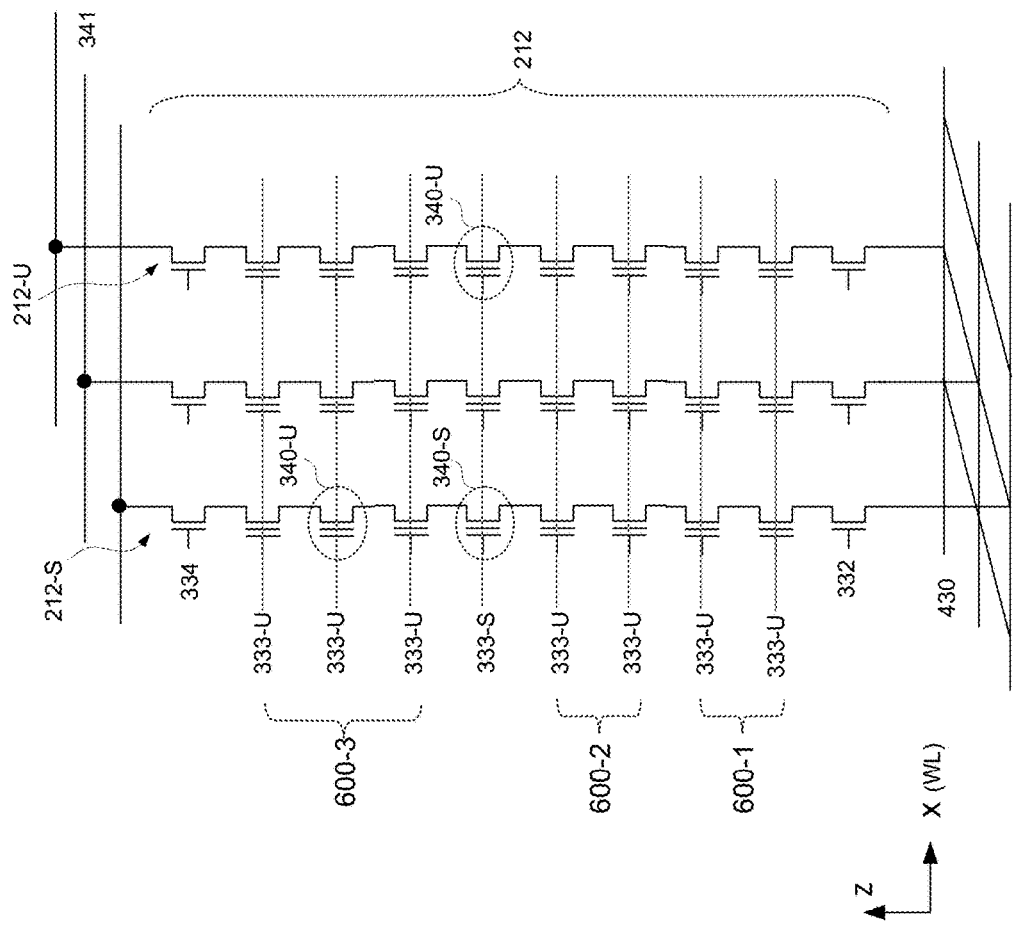

FIG. 6 illustrates an implementation of the maximum pass voltages $V_{pass\_max}$ for the memory block 103, according to some embodiments of the present disclosure. In this example, the unselected WL 333-U can be separated into two or more WL groups 600, e.g., a first WL group 600-1, a second WL group 600-2, a third WL group 600-3, . . . , etc. Each WL group 600 can include one or more unselected WLs 333-U. For example, the first WL group 600-1 includes a first set of unselected WLs 333-U. The second WL group 600-2 includes a second set of unselected WLs 333-U. And the third WL group 600-3 includes a third set of unselected WLs 333-U. The number of unselected WLs 333-U in each WL group 600 can be the same or different.

The unselected WLs 333-U in the same WL group 600 can be assigned with the same maximum pass voltages $V_{pass\_max}$. For example, the first set of unselected WLs 333-U in the first WL group 600-1 can have a first maximum pass voltages $V_{pass\_max-1}$. The second set of unselected WLs 333-U in the second WL group 600-2 can have a second maximum pass voltages $V_{pass\_max-2}$. The third set of unselected WLs 333-U in the third WL group 600-3 can have a third maximum pass voltages $V_{pass\_max-3}$. The first, second and third maximum pass voltages $V_{pass\_max-1}$, $V_{pass\_max-2}$ and $V_{pass\_max-3}$ can be the same or different from each other. During the program operation, the first WL group 600-1 can be applied with a first pass voltage $V_{pass\_1}$ that is less than the first maximum pass voltage $V_{pass\_max-1}$; the second WL group 600-2 can be applied a second pass voltage $V_{pass\_2}$ that is less than the second maximum pass voltage $V_{pass\_max-2}$; and the third WL group 600-3 can be applied a third pass voltage $V_{pass\_3}$ that is less than the third maximum pass voltage $V_{pass\_max-3}$. The first pass voltage $V_{pass\_1}$, the second pass voltage $V_{pass\_2}$ and the third pass voltage $V_{pass\_3}$ can be the same or different.

Figure 7A:
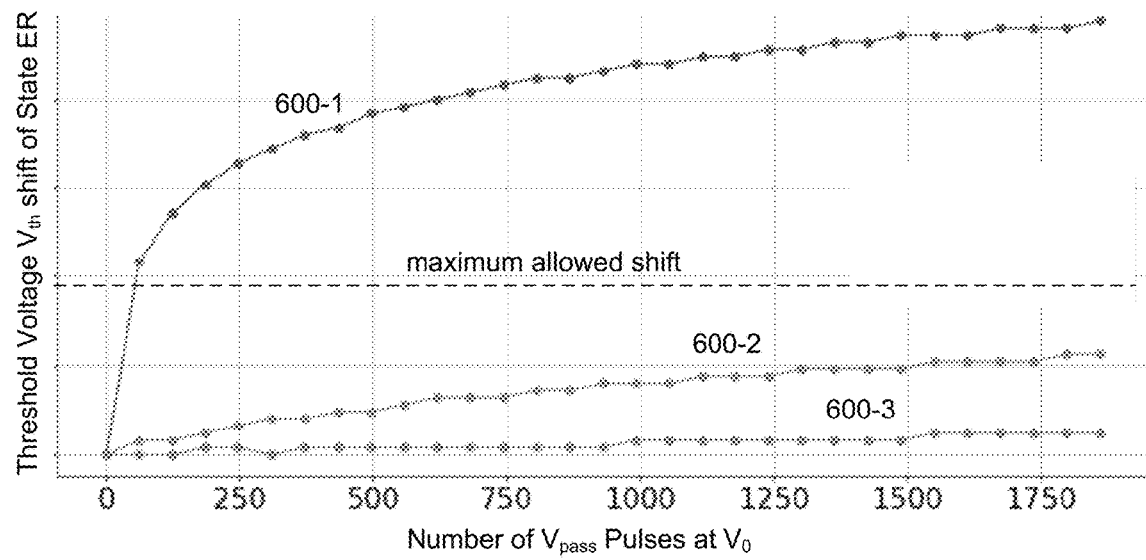
FIG. 7A illustrates threshold voltage shifts of the memory cells in various word line groups after applying pulses with a pass voltage, according to some embodiments of the present disclosure.

The unselected WLs 333-U can be grouped according to the vulnerability of the corresponding memory cells to the pass disturb. And the maximum pass voltage $V_{pass\_max}$ for each WL group 600 can be pre-determined, prior to the program operation. The vulnerability of each WL 333 can be determined by measuring the shift $\Delta V_{th}$ of the threshold voltage $V_{th}$, for example, at the state ER, after n number of pulses having a magnitude of the pass voltage $V_{pass}$. FIG. 7A illustrates the shifts $\Delta V_{th}$ of the threshold voltages $V_{th}$ of state ER versus the number of pulses having the magnitude of the pass voltage $V_{pass}$ of a pre-given value $V_0$ (e.g., 12 V), according to some embodiments of the present disclosure. The pre-given value $V_0$ can be selected such that when the pass voltage $V_{pass}$ $V_0$, the program disturb to a fourth set of the unselected memory cells 340-U that are addressed by the selected WL 333-S can be minimized. As illustrated, when the first, second and third WL groups 600-1, 600-2 and 600-3 are applied with the same pass voltage $V_{pass}$ of the pre-given value $V_0$, the first set of unselected memory cells addressed by the first WL group 600-1 are most vulnerable to pass disturb, i.e., suffering the largest shift $\Delta V_{th}$ of threshold voltage $V_{th}$. In the example in FIG. 7A, the shifts $\Delta V_{th}$ of the threshold voltages $V_{th}$ are below a maximum allowed shift α for the second set and the third set of unselected memory cells in the respective second and third WL groups 600-2 and 600-3. Thus, the second and third maximum pass voltages $V_{pass}$ max-2 and $V_{pass\_max-3}$ can be determined to be the pre-given value $V_0$. And the first maximum pass voltage $V_{pass\_max-1}$ for the first WL group 600-1 needs to be lowered from the pre-given value $V_0$.

Figure 7B:
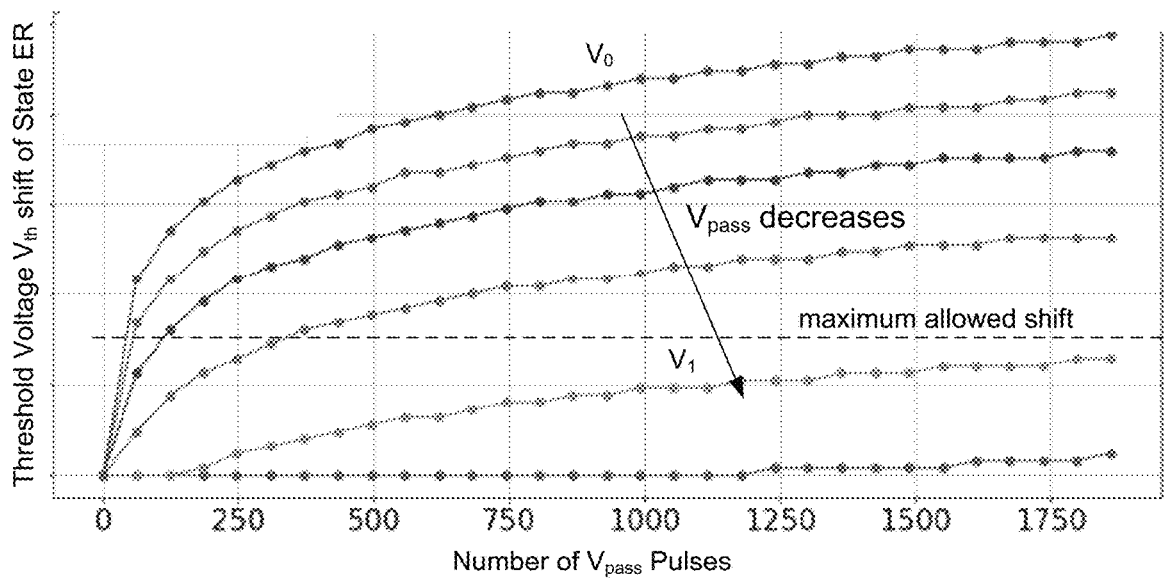
FIG. 7B illustrates threshold voltage shifts of the memory cells in a certain word line group after applying pulses with various pass voltages, according to some embodiments of the present disclosure.

FIG. 7B illustrates a method to determine the maximum pass voltage $V_{pass\_max}$, according to some embodiments of the present disclosure. In this example, the shifts $\Delta V_{th}$ of the threshold voltage $V_{th}$ of state ER from the first set of unselected memory cells 340-U in the first WL group 600-1 are measured versus the number of pulses having the magnitude of the pass voltage $V_{pass}$. In this measurement, the pass voltage $V_{pass}$ decreases incrementally from the pre-given value $V_0$. The shift $\Delta V_{th}$ of the threshold voltage $V_{th}$ decreases when the pass voltage $V_{pass}$ decreases. The first maximum pass voltages $V_{pass\_max-1}$ can be determined when the shift $\Delta V_{th}$ of the threshold voltage $V_{th}$ is below the maximum allowed shift α. Here the first maximum pass voltages $V_{pass\_max-1}$ can be $V_1$, where $V_1 < V_0$.

Figure 8:
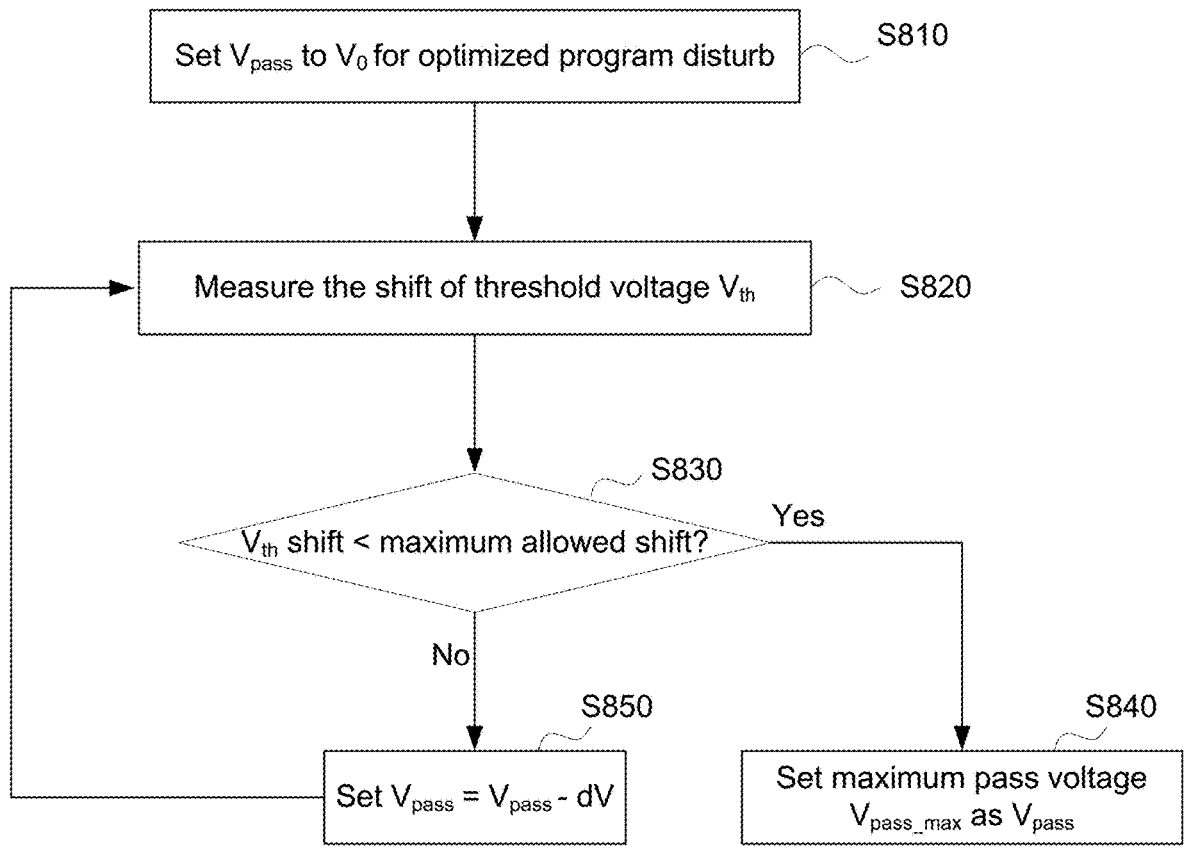
FIG. 8 illustrates an operation flow to determine the maximum pass voltage for memory cells in a certain word line group, according to some embodiments of the present disclosure.

FIG. 8 illustrates a method 800 for determining the maximum pass voltage $V_{pass}$ for each WL group 600, accordance to some embodiments of the present disclosure. It should be understood that the steps shown in method 800 are not exhaustive and that other steps can be performed as well before, after, or between any of the illustrated steps. In some embodiments, some steps of method 800 can be omitted or include other steps that are not described here for simplicity. In some embodiments, steps of method 800 can be performed in a different order and/or vary.

At step S810, the pass voltage $V_{pass}$ is set at the pre-given value $V_0$ initially, where the pre-given value $V_0$ is chosen such that the program disturb can be minimized for the fourth set of unselected memory cells 340-U connected to the selected WL 333-S. As discussed previously, program disturb can be suppressed using the self-boosting technique. Because higher pass voltage $V_{pass}$ can be more effective in self-boosting and in suppressing program disturb, the pre-given value $V_0$ can be too high for some WL groups (e.g., WL group 600-1 at the bottom, closer to the substrate), which can result in more pass disturb in, for example, the first set of unselected memory cells 340-U.

At step S820, the threshold voltages $V_{th}$ of the first set of unselected memory cells 340-U in the first WL group 600-1 are measured after n number of pulses having a magnitude of the pass voltage $V_{pass}$. The shift $\Delta V_{th}$ of the threshold voltage $V_{th}$ (e.g., the ER state) can then be compared with the maximum allowed shift α at step S830.

If the shift $\Delta V_{th}$ is smaller than the maximum allowed shift α, the instant pass voltage $V_{pass}$ can be set as the first maximum pass voltage $V_{pass\_max-1}$ for the first WL group 600-1 at step S840.

If the shift $\Delta V_{th}$ is larger than the maximum allowed shift α, the pass voltage $V_{pass}$ can be lowered by a predetermined value dV, as shown in step S850, i.e., the pass voltage $V_{pass}$ can be replaced by a new value $V_{pass}$–dV.

The threshold voltage $V_{th}$ of the memory cells in the WL group are measured again at S820 and its shift is checked at step S830. The steps S850, S820 and S830 are repeated until the condition in step S830 is satisfied and the maximum pass voltage $V_{pass\_max-1}$ can be determined for the first WL group 600 at step S840.

By performing the method shown in FIG. 8, the maximum pass voltage $V_{pass\_max}$ can be determined with optimized program disturb and pass disturb for each WL group 600.

Figure 9A:
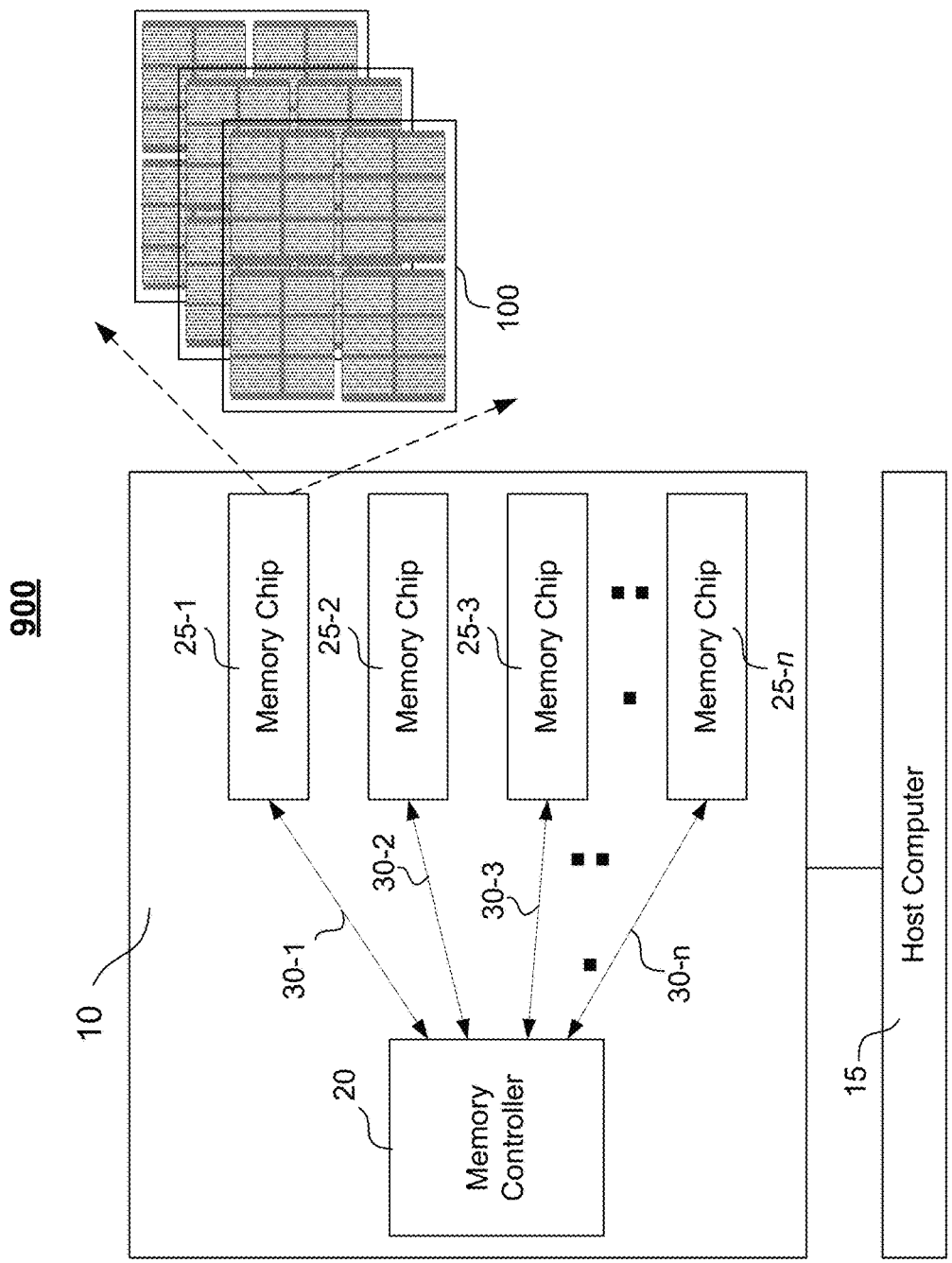
FIGS. 9A-C illustrate storage systems with one or more memory chips, according to some embodiments of the present disclosure.

FIG. 9A illustrates a block diagram of an exemplary system 900 having a storage system 10, according to some embodiments of the present disclosure. System 900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more memory chips 25-1, 25-2, 25-3, . . . , 25-n. Each semiconductor memory chip 25 (hereafter just "memory chip") can be a NAND chip (i.e., "flash," "NAND flash" or "NAND"). The storage system 10 can communicate with a host computer 15 through the memory controller 20, where the memory controller 20 can be connected to the one or more memory chips 25-1, 25-2, 25-3, . . . , 25-n, via one or more memory channels 30-1, 30-2, 30-3, . . . , 30-n. In some embodiments, each memory chip 25 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the NAND storage system or storage system 10 or retrieves data by reading the storage system 10. The memory controller 20 can handle I/O requests received from the host computer 15, ensure data integrity and efficient storage, and manage the memory chip 25. The memory channels 30 can provide data and control communication between the memory controller 20 and each memory chip 25 via a data bus. The memory controller 20 can select one of the memory chips 25 according to a chip enable signal.

In some embodiments, each memory chip 25 in FIG. 9A can include one or more memory dies 100, where each memory die can be similar to the 3D memory device 100 shown in FIG. 1.

Figure 9B:
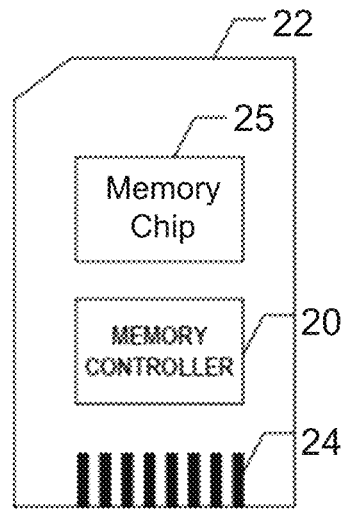
Figure 9C:
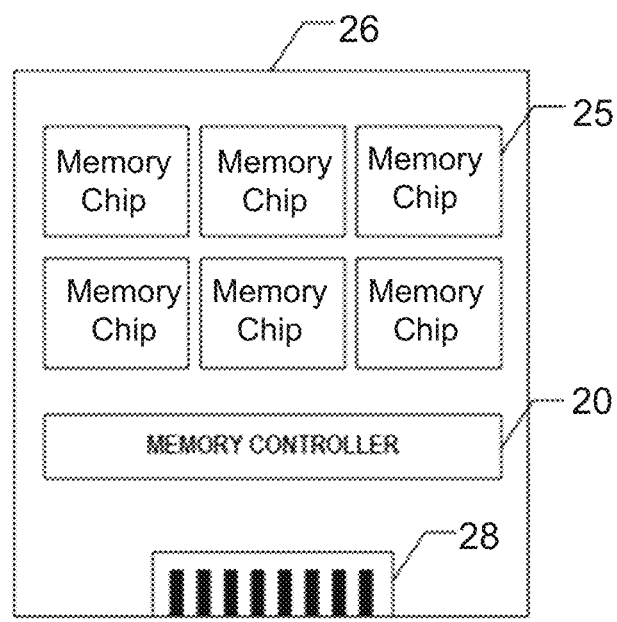

Memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 9B, memory controller 20 and a single memory chip 25 may be integrated into a memory card 22. Memory card 22 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 22 can further include a memory card connector 24 coupling memory card 22 with a host (e.g., host computer 15 in FIG. 9A). In another example as shown in FIG. 9C, memory controller 20 and multiple memory chip 25 may be integrated into an solid state drive (SSD) 26. SSD 26 can further include an SSD connector 28 coupling SSD 26 with a host (e.g., the host computer 15 in FIG. 9A).

Figure 10:
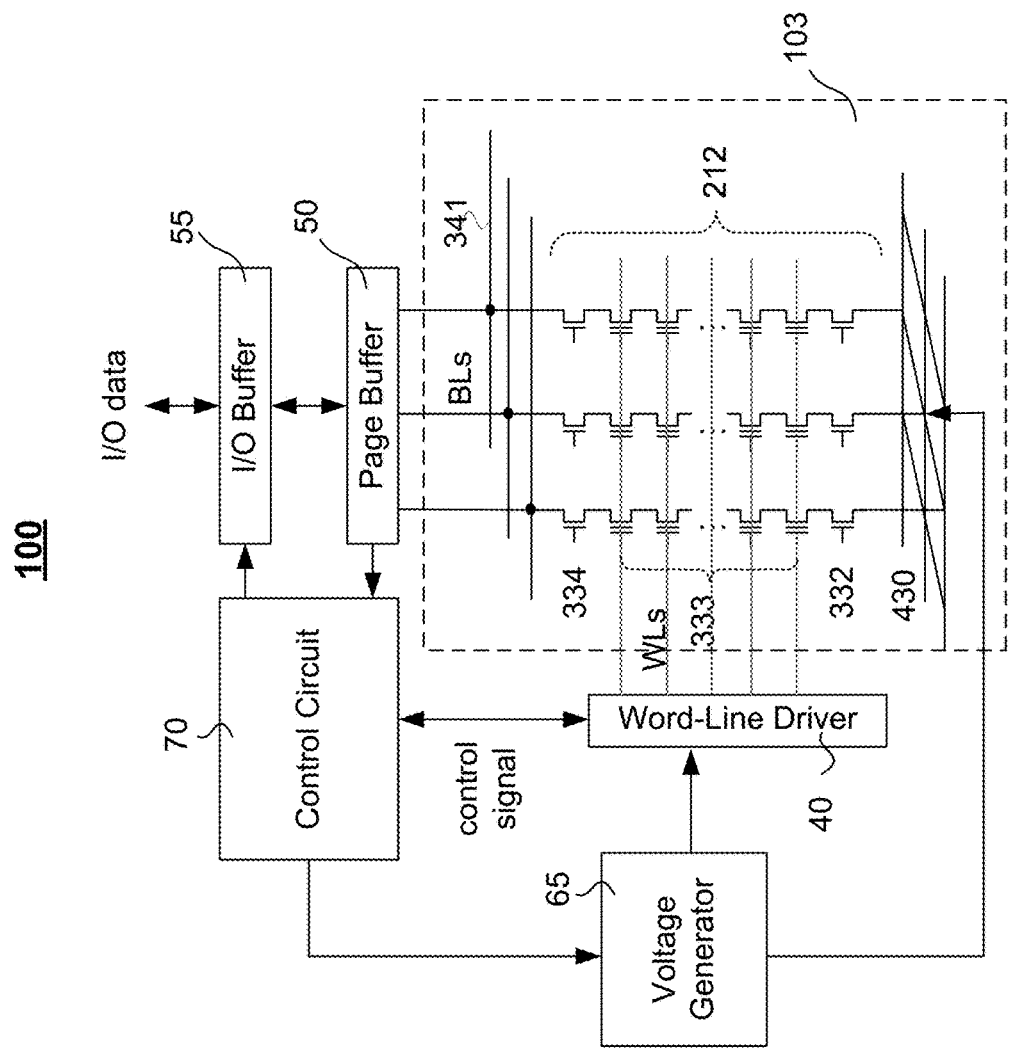
FIG. 10 illustrates a schematic diagram of a memory die, according to some embodiments of the present disclosure.

FIG. 10 illustrates a schematic diagram of the memory die 100, according to some embodiments of the present disclosure. The memory die 100 includes one or more memory blocks 103. The periphery circuit of the memory die 100 includes many digital, analog, and/or mixed-signal circuits to support functions of the memory block 103, for example, a page buffer 50, a word line driver 40, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

It is noted that the layout of the electronic components in the storage system 10 and the memory die 100 in FIGS. 9A-C and 10 are shown as examples. The storage system 10 and the memory die 100 can have other layout and can include additional components. For example, the memory die 100 can also have sense amplifier, column decoder, etc. The storage system 10 can also include firmware, data scrambler, etc.

As shown in FIG. 10, the memory block 103 is coupled with the word line driver 40 via word lines (e.g., WLs 333) and/or selection lines (e.g., LSG 332 and TSG 334). The memory block 103 is coupled with the page buffer 50 via bit lines (e.g., BLs 341). The word line driver 40 can select one of the memory blocks 103 on the memory die 100 in response to a control signal provided by the control circuit 70. The word line driver 40 can transfer voltages provided from the voltage generator 65 to the word lines according to the control signal. During the program operation, the word line driver 40 can transfer the program voltage $V_{pgm}$ to the selected word line and the pass voltage $V_{pass}$ to the unselected word lines according to the control signal received from the control 70.

During the program operation, the page buffer 50 can provide the inhibit voltage $V_{inhibit}$ to the unselected bit lines and connect the selected bit line to ground according to I/O data to be programmed. The input/output buffer 55 can transfer the I/O data to the page buffer 50 as well as input addresses or commands to the control circuit 70 or the word-line driver 40.

The control circuit 70 can control the page buffer 50 and the word line driver 40 in response to the commands transferred by the input/output buffer 55. During the program operation, the control circuit 70 can control the word line driver 40 and the page buffer 50 to program a selected memory cell.

The voltage generator 65 can generate voltages to be supplied to word lines and bit lines under the control of the control circuit 70. The voltages generated by the voltage generator 65 include the program voltage $V_{pgm}$, the pass voltage $V_{pass}$, the inhibit voltage $V_{inhibit}$.

In summary, the present disclosure discloses a method for programming a three-dimensional (3D) memory device. The 3D memory device has a plurality of memory strings with memory cells vertically stacked, and each memory cell is addressable through a word line and a bit line. The method for programming the 3D memory device includes the following steps: applying a program voltage on a selected word line; applying a first pass voltage on a first group of unselected word lines; and applying a second pass voltage on a second group of unselected word lines, wherein the second pass voltage is different from the first pass voltage.

The present disclosure also discloses a three-dimensional (3D) memory device. The 3D memory device includes a plurality of memory cells that are connected to word lines and bit lines configured for addressing each of the plurality of memory cells, wherein the plurality of memory cells are vertically stacked. The 3D memory device also includes a peripheral circuit, configured to program a selected memory cell. The peripheral circuit includes a control circuit, configured to send a control signal to a word line driver. The word line driver, according to the control signal, is configured to apply a program voltage on a selected word line; apply a first pass voltage on a first group of unselected word lines; and apply a second pass voltage on a second group of unselected word lines, wherein the second pass voltage is different from the first pass voltage.

The present disclosure further discloses a storage system, wherein the storage system includes a memory controller and a memory chip (e.g., a three-dimensional memory device). The memory chip includes a plurality of memory cells connected to word lines and bit lines configured for addressing each of the plurality of memory cells, wherein the plurality of memory cells are vertically stacked. The memory chip also includes a peripheral circuit configured to program a selected memory cell, the peripheral circuit comprising a control circuit. The control circuit is configured to send a control signal to a word line driver, wherein the word line driver, according to the control signal, is configured to apply a program voltage on a selected word line; apply a first pass voltage on a first group of unselected word lines; and apply a second pass voltage on a second group of unselected word lines, wherein the second pass voltage is different from the first pass voltage.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   selected word lines coupled to first memory cells;
   a first group of unselected word lines coupled to second memory cells;
   a second group of unselected word lines coupled to third memory cells; and
   a peripheral circuit coupled to the selected word lines, the first group of unselected word lines, and the second group of unselected word lines, wherein the peripheral circuit is configured to:
     apply program voltages on the selected word lines;
     apply first pass voltages on the first group of unselected word lines;
     apply second pass voltages on the second group of unselected word lines, wherein a first maximum value of the first pass voltages is different from a second maximum value of the second pass voltages; and
     program memory cells in sequence, the memory cells comprising the first memory cells, the second memory cells, and the third memory cells,
   wherein:
     the first maximum value of the first pass voltages is a maximum value of all pass voltage pulses of the first group of unselected word lines during program operations of the memory cells coupled to two or more word lines in sequence; and
     the second maximum value of the second pass voltages is a maximum value of all pass voltage pulses of the second group of unselected word lines during the program operations of the memory cells coupled to two or more word lines in sequence.

2. The memory device of claim 1, wherein the first group of unselected word lines comprise one or more first unselected word lines, and the second group of unselected word lines comprise one or more second unselected word lines.

3. The memory device of claim 2, wherein a number of the one or more first unselected word lines is the same or different from a number of the one or more second unselected word lines.

4. The memory device of claim 1, wherein the first maximum value of the first pass voltages is less than the second maximum value of the second pass voltages.

5. The memory device of claim 4, further comprising an array common source coupled to the memory cells, wherein the second memory cells and the third memory cells are located on a same side of the array common source, and the third memory cells are between the array common source and the second memory cells.

6. The memory device of claim 4, further comprising a channel structure extending in a first direction, wherein the channel structure comprises a first part and a second part, the first part comprises a part of the second memory cells, the second part comprises a part of the third memory cells, a size of the first part in a second direction is larger than a size of the second part in the second direction, and the second direction is perpendicular to the first direction.

7. The memory device of claim 1, wherein the second pass voltages are different from the first pass voltages.

8. The memory device of claim 1, wherein after programming the selected word lines, a first shift of threshold voltages of one of the second memory cells is different from a second shift of threshold voltages of one of the third memory cells.

9. The memory device of claim 8, wherein the first shift is larger than the second shift, and the first maximum value of the first pass voltages is less than the second maximum value of the second pass voltages.

10. The memory device of claim 1, wherein the first maximum value of the first pass voltages is determined when shifts of threshold voltages of the second memory cells are less than a maximum allowed shift.

11. A method for programming a memory device, the memory device comprising selected word lines coupled to first memory cells, a first group of unselected word lines coupled to second memory cells, and a second group of unselected word lines coupled to third memory cells, the method comprising:
applying program voltages on the selected word lines;
applying first pass voltages on the first group of unselected word lines;
applying second pass voltages on the second group of unselected word lines, wherein a first maximum value of the first pass voltages is different from a second maximum value of the second pass voltages; and
programming memory cells in sequence, the memory cells comprising the first memory cells, the second memory cells, and the third memory cells,
wherein:
the first maximum value of the first pass voltages is a maximum value of all pass voltage pulses of the first group of unselected word lines during program operations of the memory cells coupled to two or more word lines in sequence; and
the second maximum value of the second pass voltages is a maximum value of all pass voltage pulses of the second group of unselected word lines during the program operations of the memory cells coupled to two or more word lines in sequence.

12. The method of claim 11, wherein the first group of unselected word lines comprise one or more first unselected word lines, the second group of unselected word lines comprise one or more second unselected word lines.

13. The method of claim 11, wherein the first maximum value of the first pass voltages is less than the second maximum value of the second pass voltages.

14. The method of claim 13, further comprising applying a source voltage on an array common source, wherein the first memory cells, the second memory cells, and the third memory cells are located on a same side of the array common source, and the third memory cells are between the array common source and the second memory cells.

15. The method of claim 11, wherein the second pass voltages are different from the first pass voltages.

16. The method of claim 11, further comprising:
determining the first maximum value of the first pass voltages to suppress pass disturb on the second memory cells; and
determining the second maximum value of the second pass voltages to suppress pass disturb on the third memory cells.

17. The method of claim 16, wherein the determining the first maximum value of the first pass voltages comprises:
measuring shifts of threshold voltages of the second memory cells; and
setting the first pass voltages as the first maximum value of the first pass voltages when the shifts of the threshold voltages of the second memory cells are less than a maximum allowed shift.

18. A storage system, comprising:
a memory controller; and
a memory device, comprising:
selected word lines coupled to first memory cells;
a first group of unselected word lines coupled to second memory cells;
a second group of unselected word lines coupled to third memory cells; and
a peripheral circuit coupled to the selected word lines, the first group of unselected word lines and the second group of unselected word lines, wherein the peripheral circuit is configured to:
apply program voltages on the selected word line;
apply first pass voltages on the first group of unselected word lines; and
apply second pass voltages on the second group of unselected word lines, wherein a first maximum value of the first pass voltages is different from a second maximum value of the second pass voltages.

19. The memory device of claim 1, wherein when a shift of threshold voltages of the second memory cells is more than a maximum allowed shift, a current pass voltage applied on the first group of unselected word lines coupled to the second memory cells is lowered as a new pass voltage to determine the first maximum value of the first pass voltages.

20. The method of claim 11, further comprising when a shift of threshold voltages of the second memory cells is more than a maximum allowed shift, lowering a current pass voltage applied on the first group of unselected word lines coupled to the second memory cells to determine the first maximum value of the first pass voltages.

* * * * *